US008292246B2

(12) United States Patent
Drumm et al.

(10) Patent No.: US 8,292,246 B2
(45) Date of Patent: Oct. 23, 2012

(54) APPARATUS FOR AN INCLINABLE SUPPORT OF A SPEAKER

(75) Inventors: Martin Drumm, München (DE); Dipl.-Ing. Guntram Pletz, Ruschberg (DE)

(73) Assignee: Adam Hall GmbH (DE)

( * ) Notice: Subject to any disclaimer, the term of this patent is extended or adjusted under 35 U.S.C. 154(b) by 1672 days.

(21) Appl. No.: 11/698,343

(22) Filed: Jan. 26, 2007

(65) Prior Publication Data

US 2007/0195972 A1 Aug. 23, 2007

(30) Foreign Application Priority Data

Jan. 26, 2006 (DE) ......................... 10 2006 003 671
Mar. 29, 2006 (DE) ......................... 10 2006 014 816

(51) Int. Cl.

*A47K 1/08* (2006.01)
*A47H 1/10* (2006.01)
*B42F 13/00* (2006.01)
*E04G 3/00* (2006.01)
*H04R 1/02* (2006.01)
*H05K 5/00* (2006.01)

(52) U.S. Cl. ..................... 248/311.2; 248/323; 248/343; 248/291.1; 248/274.1; 381/390; 381/368; 381/386; 381/387; 381/87; 181/141; 181/150

(58) Field of Classification Search ............... 248/311.2, 248/320, 323, 343, 291.1, 548, 274.1; 381/390, 381/395, 368, 386, 387, 87; 181/141, 150
See application file for complete search history.

(56) References Cited

U.S. PATENT DOCUMENTS 4,984,278 A * 1/1991 Frye et al. ..................... 381/387
5,172,745 A * 12/1992 Wang ....................... 160/370.22
5,251,859 A * 10/1993 Cyrell et al. ............. 248/288.51
5,321,760 A * 6/1994 Gray ............................... 381/86
5,692,721 A * 12/1997 Roberts ......................... 248/551
5,704,581 A * 1/1998 Chen ............................. 248/371
5,730,409 A * 3/1998 Baron et al. ............. 248/292.12
6,079,683 A * 6/2000 Lin .......................... 248/292.12
6,347,776 B1 * 2/2002 Chuang .................... 248/288.51
2002/0118853 A1 * 8/2002 Flentje .......................... 381/336
2003/0142973 A1 7/2003 Sawada
2005/0100187 A1 * 5/2005 Yang ............................. 381/386
2007/0025580 A1 * 2/2007 Reardon et al. ............... 381/387
2007/0075202 A1 * 4/2007 Gordon .................... 248/289.11
2007/0195972 A1 * 8/2007 Drumm et al. .................. 381/87
2008/0199037 A1 * 8/2008 Xu et al. ....................... 381/387

FOREIGN PATENT DOCUMENTS

DE 203 16 984 4/2004
EP 0 022 759 1/1981

OTHER PUBLICATIONS

European Search Report dated May 3, 2007 issued in co-pending EPO Application No. 07001759.5.

* cited by examiner

*Primary Examiner* — Terrell McKinnon
*Assistant Examiner* — Christopher Garft
(74) *Attorney, Agent, or Firm* — Bliss McGlynn, P.C.

(57) ABSTRACT

An apparatus for an inclinable support of a speaker on a rod includes a sleeve for receiving an end portion of the rod provided with a closed head section, a mounting device adapted to be attached to the speaker having an elongated opening formed as a guidance for the sleeve and a bearing spaced apart from the opening, in which the sleeve with the head section is supported pivotally, and at least one locking device for the sleeve provided in the region of the opening.

6 Claims, 3 Drawing Sheets

APPARATUS FOR AN INCLINABLE SUPPORT OF A SPEAKER

BACKGROUND OF THE INVENTION

1. Field of the Invention

The present invention relates generally to speakers and, more specifically, to an apparatus for an inclinable support of a speaker on a rod.

2. Description of the Related Art

Speakers or loudspeaker enclosures, in the following speakers, are often arranged elevated on stands for musical presentations, in particular when many auditors are present, such that the sound is emitted and extends over the heads of the auditors. For this purpose, the speaker is set on a rod or a pipe of the stand by a suitable mounting device. However, an inclination of the speakers is often desired, for which an appropriate apparatus for an inclinable support is required at a speaker.

From DE 200 100 582 U1, a speaker system is known, in which at least two recesses for the upper end of a rod are provided for attaching the speaker housing at a rod in the bottom wall of the speaker housing, the recesses having inclination angles differing from each other. Therewith, however, the number of inclination angles is limited to some few angles.

SUMMARY OF THE INVENTION

It is an object of the present invention to enable an inclination of the speaker in a plurality of angular positions, i.e. a precise gradation of a relatively large adjustable range.

According to the present invention, this object is solved in that an apparatus for an inclinable support of a speaker on a rod includes a sleeve formed for receiving an end part of the rod provided with a closed head section, a mounting part formed to be attached at the speaker comprises an elongated opening formed as a guide for the sleeve and a bearing which is spaced apart from the opening, in which the sleeve together with the head section is supported pivotally, and that at least one locking device for the sleeve is provided in the region of the opening.

The inventive apparatus offers the advantage, vis-à-vis the known speaker system, that the speaker does not have to be removed from the rod for changing the inclination angle. Only a load relieving is required, wherein no repeated attaching on the rod is required after having changed the inclination angle.

Dependent on the construction of the locking device, a precise gradation of the inclination angle is possible. The inventive apparatus further has the advantage that the fulcrum is positioned in the inside of the speaker, which counteracts a tilting tendency of the speaker box when the inclination becomes larger. In addition, no components projecting substantially from the housing of the speaker are required, which is advantageous when the speaker is frequently transported.

A preferred embodiment of the inventive apparatus discloses that an elastic member is operatively configured between the bearing and the head section such that the locking device becomes effective upon loading the mounting device with the speaker. In this context, it is preferably provided that the locking device is formed by two rows of teeth extending parallel to the longitudinal sides of the opening in a circular arc, the row of teeth being operatively engaged with teeth provided at projections which protrude laterally from the open end portion of the sleeve.

This embodiment is characterized in that no manipulation is required for fixing the speaker in the inclination to be adjusted. Consequently, it may, for example, also not be forgotten to fasten a screw provided for fixation.

The inventive apparatus may also be configured such that the projections engage in circular arched undercuts of the opening, which hold the sleeve in case of lacking load by the speaker. With these measures, it is on the one hand secured that the sleeve does not fall from the mounting device when it is not loaded by the speaker. In addition, the components of the inventive apparatus can be die cast using plastics in a simple manner. By chamfering the projections upon a sufficient elasticity of the components, the sleeve may be pressed with a suitable tool into the mounting device during manufacturing, such that the projections lock behind the undercuts.

A further advantageous embodiment discloses that the undercuts are configured as an additional locking device by a toothing. Therewith, the sleeve is maintained in the selected position, also when a load is lacking. If this embodiment is configured such that the locking points of the additional locking device and the locking device are opposing each other, another advantage can be achieved as upon placing the speaker onto the stand, the same angular position is adopted upon releasing the speaker as during the placing thereof.

A particularly safe lateral guidance of the sleeve is enabled in a further development of the present invention in that the sleeve comprises two laterally protruding pins in the region of its head section, the pins engaging into grooves which extend at opposing sides of the mounting device between the opening and the bearing.

For receiving the load acting on the joint due to the weight of the speakers, it may be provided in this embodiment that the sleeve comprises at least one half-cylinder shaped body at its head section, the body being pivotally supported in at least one half bearing in the mounting device upon a loading of the mounting device with the speaker. In case of a centrally located elastic member, one half-cylinder shaped body is respectively provided at both sides.

A simple assembly of the mounting device at the speaker is provided in that the mounting device is provided with a flange surrounding the opening and being adapted to be fixed to the speaker.

Other objects, features, and advantages of the present invention will be readily appreciated, as the same becomes better understood, after reading the subsequent description taken in conjunction with the accompanying drawings.

BRIEF DESCRIPTION OF THE DRAWINGS

The embodiments of the present invention are shown in several figures in the drawings and described in more detail in the following description.

DESCRIPTION OF THE PREFERRED EMBODIMENT(S)

Figure 1:
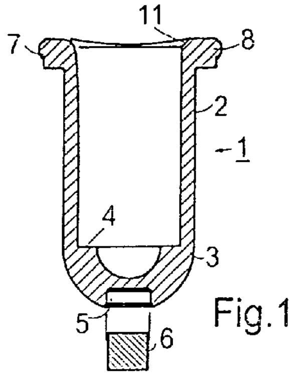
FIG. 1 and FIG. 2 show a sleeve in two views.
Figure 2:
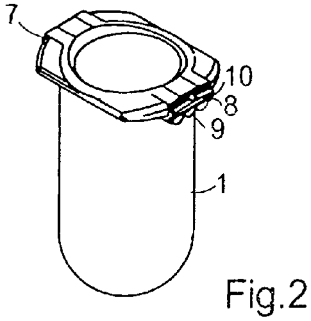

Referring now to the drawings, and in particular FIGS. 1 and 2, one embodiment of an apparatus, according to the present invention, for an inclinable support of a speaker on a rod is shown. The apparatus includes a sleeve 1. The sleeve 1 shown in FIGS. 1 and 2 includes a hollow cylinder-shaped part 2 which is followed by a hemispherical head section 3. When attaching the speaker, the rod or the pipe of the stand is inserted into the sleeve 1 up to the stopper 4. In the head section 3, there is a recess 5 for receiving an elastic member which may be formed by a rubber body 6 or a suitable spring, as is shown in FIG. 1.

Two projections 7, 8 are provided at the open end of the sleeve 1 in opposite directions. The projections 7, 8 which protrude laterally from the open end portion of the sleeve 1. The projections 7, 8 have three locking teeth 9 in the direction toward the head section and one locking tooth 10 in the opposite direction. The opening of the sleeve 1 is provided with a chamfer 11 in order to facilitate the attaching onto the stand.

Figure 3:
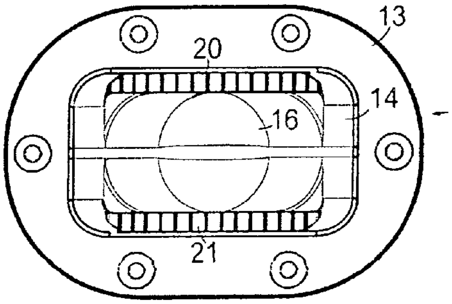
FIG. 3 to FIG. 5 show a mounting device in three views.
Figure 4:
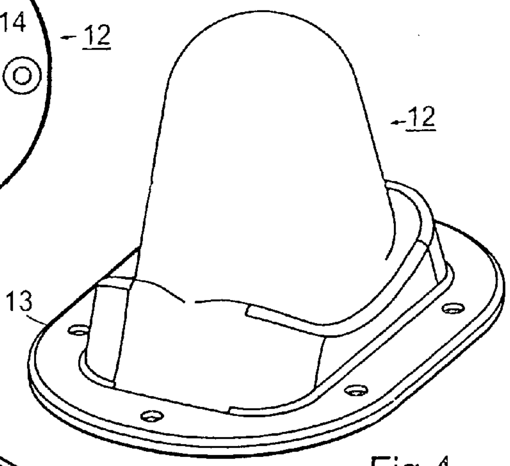
Figure 5:
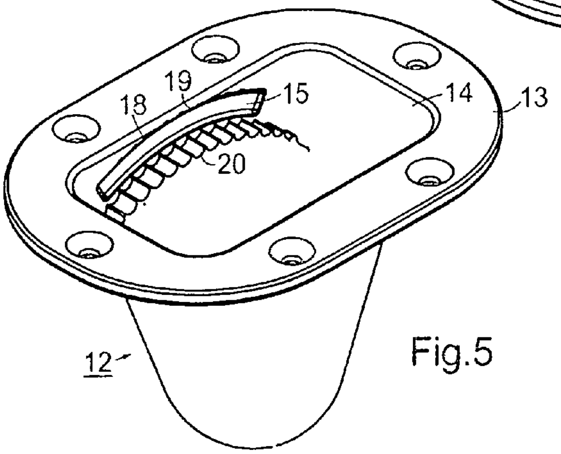
Figure 6:
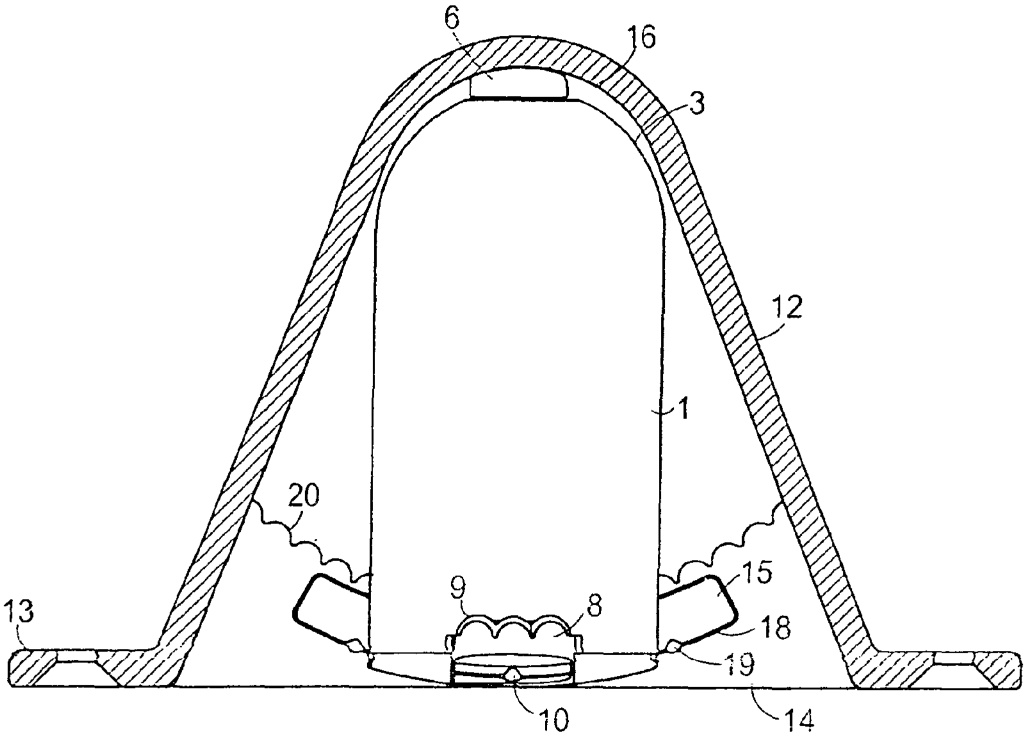
FIG. 6 shows the embodiment according to FIGS. 1 to 3 in an assembled state.
Figure 7:
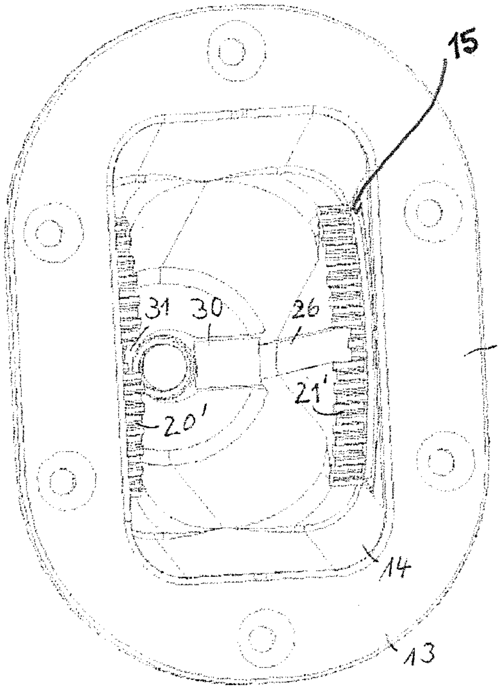
FIG. 7 to FIG. 10 show a sleeve and a mounting device of a further embodiment, respectively in two views.
Figure 8:
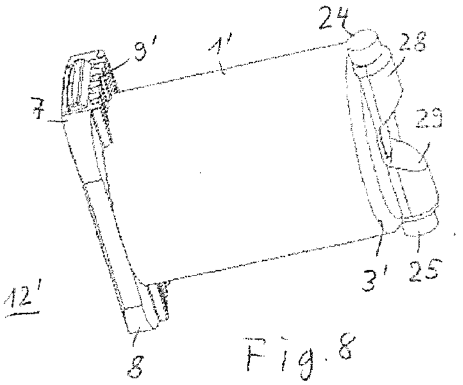
Figure 10:
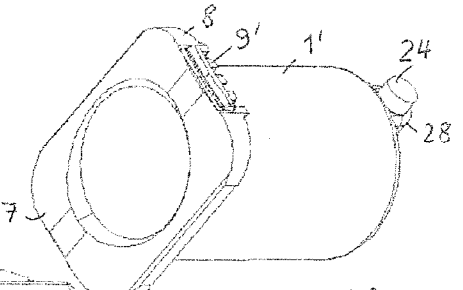
Figure 9:
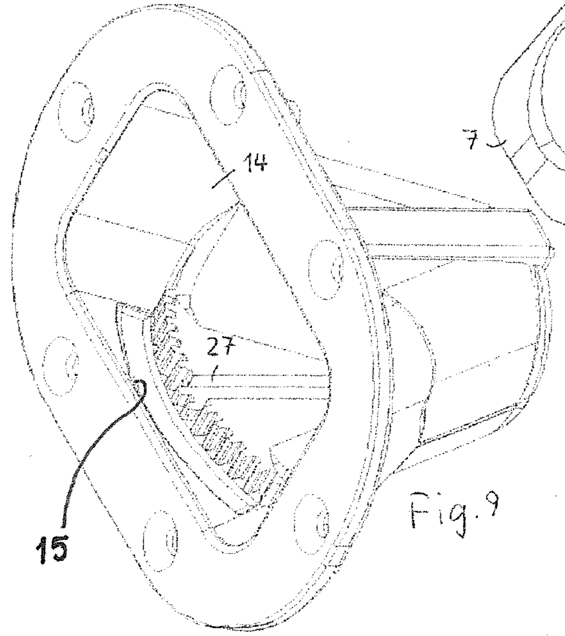

The apparatus also includes a mounting device 12. For easier perceptibility of the course of the cavity of the mounting device 12, edges which are normally not visible have been maintained in FIG. 3, the depiction of which is a precondition of the computer-controlled development of such components. A flange 13 having sinkholes is provided for attaching the mounting device 12 in the speaker. The flange 13 surrounds an opening 14. The opening 14, together with circular arched grooves 15 (only one is shown in FIG. 5), forms a guidance for the projections 7, 8 (FIG. 1, FIG. 2) of the sleeve 1. The head section 3 of the sleeve 1 and the lower portion 16 of the mounting device 12 form a joint, such that the sleeve 1 can be pivoted in the angular range predetermined by the opening 14. Two rows of teeth 16, 17 extend circular arched and in parallel to the longitudinal edges of the opening 14.

The apparatus includes a locking device formed by two rows of teeth 20, 21 extending circularly arc shaped and in parallel to the longitudinal sides of the opening 14. The teeth 20, 21 operatively engage with the teeth 9 at projections 7, 8. The projections 7, 8 engage in circular arc shaped undercuts 18 of the opening 14.

If the apparatus is not loaded, the elastic member presses the projections 7, 8 against the upper edges 18 (undercuts) of the grooves 15, wherein the locking teeth 9 engage into corresponding recesses 19. When the apparatus is loaded with the weight of the speaker, the elastic member is compressed, such that a locking of the locking teeth 9 and the locking teeth 20, 21 occurs. Therewith, the inclination angle of the speaker is fixed without any further manipulation. It should be appreciated that the undercuts 18 are formed by the toothing 19 as an additional locking device. It should also be appreciated that the locking points of the additional locking device 18, 19 and the locking device 20, 21 are disposed opposed to each other.

In the embodiment shown in FIGS. 7 to 10, a guidance and support of the sleeve 1' in the mounting device 12' is achieved in that two pins 24, 25 are provided at the head section 3' of the sleeve 1'. The pins 24, 25 slide in grooves 26, 27 in the mounting device 12' due to the loading and relieving by the speaker when the sleeve 1' is inserted into the mounting device 12' and when the sleeve 1' is moved. Consequently, a secure lateral guidance of the sleeve 1' in the region of the head section 3' is guaranteed in the loaded state as well as in the relieved state.

The sleeve 1' includes at least one half-cylinder shaped body at its head section 3'. In the embodiment illustrated, two half-cylinder shaped bodies 28, 29, which engage into corresponding half bearings 30, 31 in the mounting device 12', serve as a joint in the embodiment according to FIGS. 7 to 10. Consequently, the pins 24, 25 are not loaded with the weight of the speaker.

An additional difference of the further embodiment lies in the fact that the toothing 9', 20', 21' is here formed trapezoid.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. An apparatus for an inclinable support of a speaker on a rod comprising:

a hollow cylinder-shaped sleeve for receiving an end portion of the rod, said sleeve having a longitudinal axis and a closed head section, said longitudinal axis extending through a center of said closed head section, said sleeve having a plurality of projections extending outwardly from a portion of said sleeve and generally perpendicular to said longitudinal axis;

a mounting device adapted to be attached to the speaker, said mounting device having an opening formed as a guidance for said sleeve and a bearing spaced apart from said opening in which said sleeve with said head section is supported pivotally, said mounting device having a plurality of arcuately shaped first grooves extending in opposite sides of said mounting device, said projections engaging into said first grooves;

said sleeve including two laterally protruding pins in a region of said head section generally perpendicular to said longitudinal axis and said mounting device having two longitudinally extending second grooves which extend in opposite sides of said mounting device between said opening and said bearing in a direction of said longitudinal axis, said pins engaging into said second grooves; and at least one locking device for said sleeve located in a region of said opening.

2. An apparatus as set forth in claim 1 wherein said at least one locking device is formed by two rows of teeth extending circularly arc shaped and in parallel to longitudinal sides of said opening, said teeth operatively engaging with teeth at projections which protrude laterally from an open end portion of said sleeve.

3. An apparatus as set forth in claim 2 wherein said opening includes circular arc shaped undercuts engaged by said projections which hold said sleeve upon lacking load by the speaker.

4. An apparatus for an inclinable support of a speaker on a rod comprising:

a hollow cylinder-shaped sleeve for receiving an end portion of the rod, said sleeve having a longitudinal axis and a closed head section, said longitudinal axis extending through a center of said closed head section;

a mounting device adapted to be attached to the speaker, said mounting device having an opening formed as a guidance for said sleeve and a bearing spaced apart from said opening in which said sleeve with said head section is supported pivotally, said mounting device having a plurality of arcuately shaped first grooves extending in opposite sides of said mounting device and a plurality of longitudinally extending second grooves which extend in opposite sides of said mounting device between said opening and said bearing in a direction of said longitudinal axis;

at least one locking device for said sleeve located in a region of said opening;

wherein said sleeve comprises two laterally protruding pins extending outwardly from a portion of said sleeve and generally perpendicular to said longitudinal axis in a region of said head section, said pins engaging into said second grooves; and wherein said sleeve comprises at least one half-cylinder shaped body at said head section, said sleeve having a plurality of projections extending outwardly from a portion of said sleeve and generally perpendicular to said longitudinal axis and engaging into said first grooves, said body being pivotally supported in at least one half bearing in said mounting device upon a loading of said mounting device by the speaker.

5. An apparatus as set forth in claim 1 wherein said mounting device includes a flange surrounding said opening, said flange being configured to be attached to the speaker.

6. An apparatus for inclinable support of a rod comprising:

a sleeve having a longitudinal axis and a closed head section, said longitudinal axis extending through a center of said closed head section, said sleeve comprising at least one half-cylinder shaped body and laterally protruding pins extending outwardly from said closed head section and generally perpendicular to said longitudinal axis;

a mounting device having an opening and a bearing spaced apart from said opening in which said head section is supported pivotally, said mounting device having a plurality of longitudinally extending grooves extending in opposite sides of said mounting device between said opening and said bearing in a direction of said longitudinal axis; and said pins engaging into said grooves and said body being pivotally supported in said bearing in said mounting device upon a loading of said mounting device.

* * * * *